United States Patent [19]

Keller et al.

[11] 4,348,687

[45] Sep. 7, 1982

[54] CLAMPING ASSEMBLY FOR THYRISTOR COLUMN

[75] Inventors: Roman Keller, Neunkirchen; Günter Kliesch, Erlangen, both of Fed. Rep. of Germany

[73] Assignee: Siemens Aktiengesellschaft, Berlin and Munich, Fed. Rep. of Germany

[21] Appl. No.: 124,724

[22] Filed: Feb. 26, 1980

[30] Foreign Application Priority Data

Mar. 8, 1979 [DE] Fed. Rep. of Germany ....... 2909138

[51] Int. Cl.³ .................... H01L 23/42; H01L 23/44; H01L 23/46
[52] U.S. Cl. ......................... 357/79; 357/76; 357/81; 357/68
[58] Field of Search ............ 357/76, 79, 82, 81, 357/68

[56] References Cited

U.S. PATENT DOCUMENTS

| | | | |
|---|---|---|---|
| 3,223,903 | 12/1965 | Solomon | 357/79 |
| 3,523,215 | 8/1970 | Steinmetz | 357/76 |
| 3,566,958 | 3/1971 | Zelina | 357/79 |
| 3,784,885 | 1/1974 | Weidemann | 357/79 |
| 3,808,471 | 4/1974 | Grandia | 357/76 |
| 3,893,162 | 7/1975 | Weidemann | 357/79 |

Primary Examiner—Andrew J. James
Attorney, Agent, or Firm—Kenyon & Kenyon

[57] ABSTRACT

A stack or column of thyristors and cooling capsules has two end pieces and a clamping frame of plastic surrounding the stack and the end pieces. The frame consists of two end-to-end half-shells having recesses in the outer surfaces into which, after assembly, turns of glass fiber are wound to form bundles which are then cast over with plastic. A clamping element is screwed into each of the end pieces, at least one of which is a resilient power accumulator. Since the clamping device consists of insulating plastic and is curved in the regions of the stack ends, a space-saving design is obtained.

19 Claims, 9 Drawing Figures

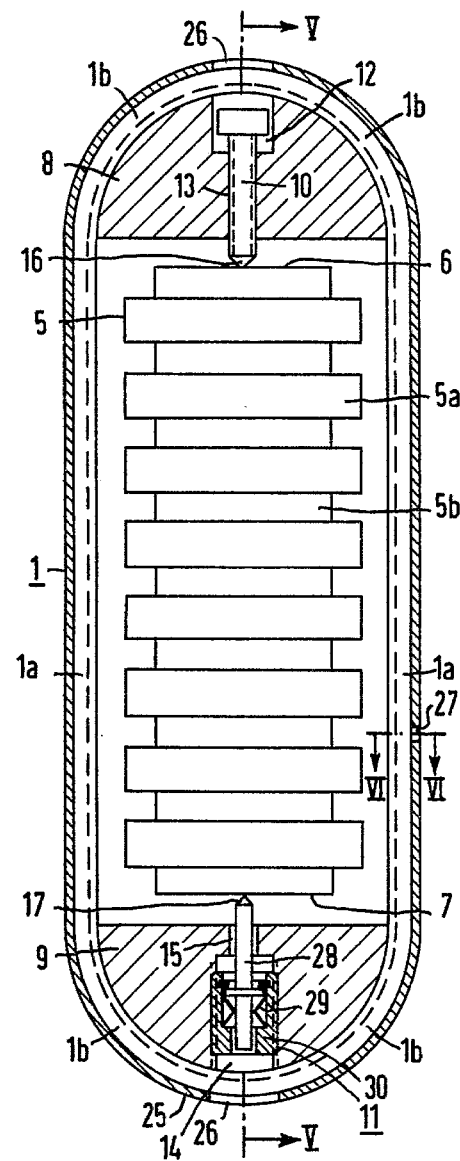
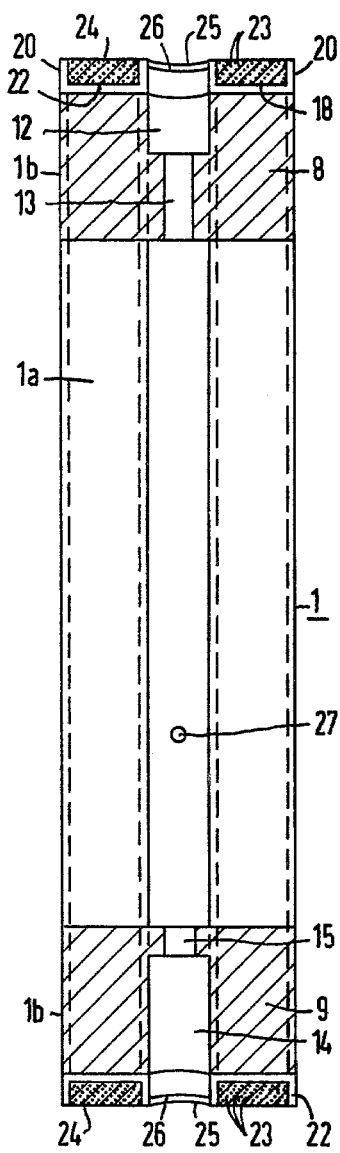
FIG 1
FIG 5

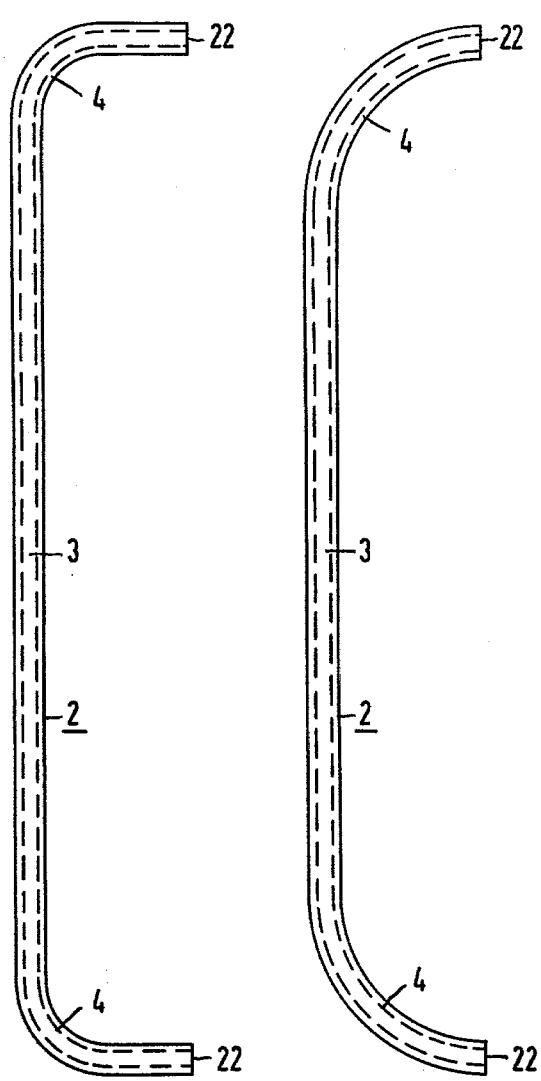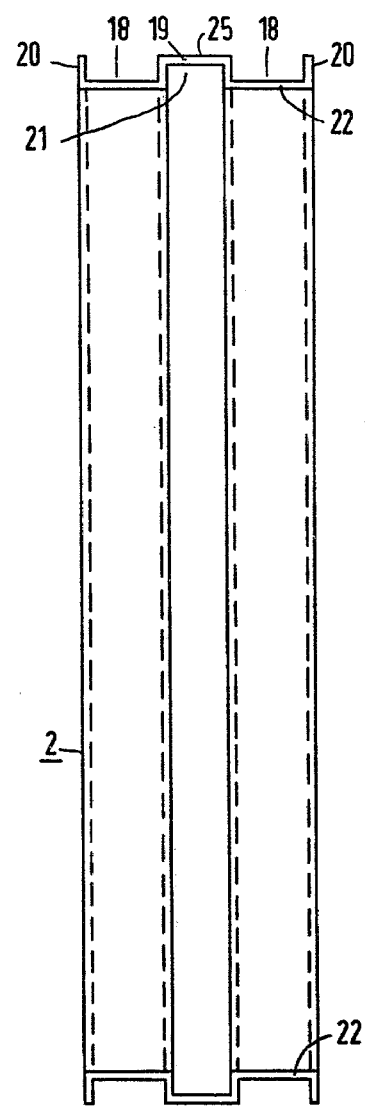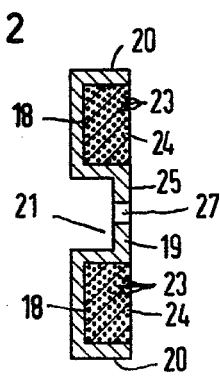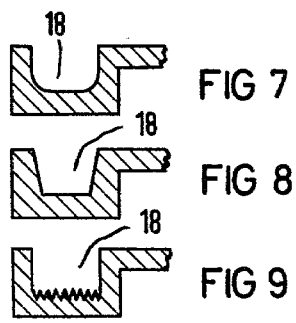

CLAMPING ASSEMBLY FOR THYRISTOR COLUMN

BACKGROUND OF THE INVENTION

The present invention relates to a thyristor column which consists of a stack of thyristors and cooling capsules. More particularly, the invention relates to such columns in which two end pieces each have a clamping element and there is a frame-like clamping device which surrounds the stack and the end pieces in an electrically insulating manner and in which each clamping element rests on one of the ends of the stack and in which at least one of the two clamping elements is resilient.

Such a thyristor column is described in U.S. Pat. No. 3,603,381. In the design described there, a stack consisting of alternatingly arranged, disc-shaped, semiconductor components and cooling capsules, in which each semiconductor component is arranged between two cooling capsules and there are two insulators at both ends of the stack, is clamped symmetrically into a frame-like metal clamping device. The clamping device consists of clamping plates and tie rods. An elastic compensation element which rests on one of the insulators is screwed into one of the clamping plates. The dimensions of such a thyristor column are determined by the air and leakage paths which are required for electrically insulating the clamping device from the stack of thyristors and cooling capsules, which operate at a higher voltage. The known thyristor column requires much space since the clamping plates are connected via insulators to the ends of the stack of thyristors and cooling capsules, and the tie rods must be installed at sufficiently large distances from the stack.

It is an object of the invention to develop a thyristor column of the type mentioned at the outset so that it takes as little space as possible while providing sufficient electrical insulation.

SUMMARY OF THE INVENTION

According to the present invention, this problem is solved by providing the frame-like clamping device in the form of two equal half-shells of insulating material, the outer surfaces of which are continuous and the end faces of which meet each other so as to provide smooth transitions of the outer surfaces. Each of the two half-shells includes at least one straight part and at least one curved part and each of the two end pieces lies, approximately form-fitting, in one of the two curved parts of the clamping device. In the outer surface of each of the two half-shells there is at least one groove (depression) lying parallel to the lateral surface of the half-shell, and a bundle comprising more than one turn of fibers surrounds both half-shells, being wound into the grooves and embedded in a casting compound.

Because the half-shells are made of insulating material, the clamping device need be spaced only a small distance from the stack of thyristors and cooling capsules, which are at a higher voltage. A space-saving design is thereby achieved. Making the clamping device of two, like, half-shells is advantageous for quantity production since only one type of half-shell nned be fabricated as a structural part, in addition to the fiber bundles and the casting compound. The two half-shells of the clamping device are connected by means of turns of fiber in bundles which circle the outer surfaces of the two assembled half-shells. The outer surfaces of the two half-shells, when joined, are continuous, so that the applied turns of fiber surround them without a kink in the regions where the end faces of the adjoining half-shells meet. This prevents breaks of the glass or carbon fibers. At every point of the outer surface of the clamping device, the fiber bundles lie flat (rest tangentially) on the clamping device, so that excessive bending moments are applied to the fibers. By winding and then casting the turns of the glass fiber or carbon fiber bundles into the grooves on the outer surface of the clamping device, a fiber-reinforced-plastic structure results which increases the strength of the clamping device. By making parts of the clamping device curved and disposed the end pieces in them in an approximately form-fitting manner, the forces which occur when the thyristor column is clamped are transmitted to the straight parts of the clamping device.

It is advantageous to make the half-shells of a plastic material because they are easy and, therefore, inexpensive to process.

Bundles of glass or carbon fibers are preferably wound around the two half-shells since, together with the cast plastic, they result in a reinforced plastic material and thereby contribute an increase in strength. The electric conductivity of carbon fibers can be offset by making the half-shells thicker.

The two half-shells are preferably designed so that each has a straight part and a curved part at each end. In the assembled clamping device, the joints between the two half-shells are located in the centers of the two curved parts of the clamping device. The joints are therefore positioned between the end pieces and the surrounding webs of reinforced plastic, lying on the end pieces, which are located underneath in a form-fitting manner after the thyristor column is clamped.

It is advantageous to design the curved parts of the two half-shells as circular arcs because good form-fit of the end pieces to the curved parts is easily obtained thereby.

It is advantageous to provide two grooves on the outer surface of each of the two curved parts of the clamping device for ease of assembly.

Preferably, two parallel grooves are provided on the outer surface of each half-shell, in order to achieve uniform loading of the assembled clamping device.

A guide channel can be arranged on the inside of the clamping device, which is used, for instance, for leads or for the centering of components. This guide is preferably arranged in the center, symmetrical with respect to the lateral surfaces of the clamping device. It is advantageous for the outer surface over the guide channel to be free of fiber bundles because holes can be made through the clamping device in this region, without interrupting the turns of the fiber bundles. Such breakthroughs can be used for current leads, coolant connections or other purposes. Also one cutout each, allowing access to the clamping elements screwed into the end pieces, and centered in the two curved parts of the clamping device, is preferably arranged. This makes possible release of the clamping elements to permit subsequent replacement of parts of the stack of thyristors and cooling capsules.

The cross-section of the grooves in the clamping device can be made in different ways, for instance, rectangular, U-shaped or trapezoidal.

Depending on the cross-sectional shape of a groove, the sequence and, thereby, the filling of the space with turns of glass or carbon fiber bundles can vary; this may be of advantage for winding and casting reasons. A serrated bottom, placed in a groove, can provide a slip-proof support for the first layer of turns of glass fiber bundles.

The clamping elements preferably support the end surfaces of the stack of thyristors and cooling capsules by way of point bearings. In this way, variations in force, due to variations in parallelism of the thyristor and cooling capsule surfaces when they are compressed in the stack, or due to thermal stresses, can easily be transmitted to the elastic compensation element, since the point bearings can move like joints relative to the end faces of the stack.

BRIEF DESCRIPTION OF THE DRAWINGS

FIG. 1 is a view, in cross-section, of a thyristor column and clamp support, in accordance with the teachings of the invention;

FIG. 2 is a side view a half-shell suitable for use in the structure of FIG. 1;

FIG. 3 is a side view of an alternative half-shell suitable for use in the structure of FIG. 1;

FIG. 4 is a front view of the half-shell of FIG. 1;

FIG. 5 is a view, in cross-section, of an assembled clamping device, showing the location of the end pieces, but omitting the pointed clamping elements;

FIG. 6 is a view in cross-section of the clamping device of FIG. 1, showing the glass fiber bundles in casting compound; and FIGS. 7 to 9 illustrate, in cross-section, some possible variations in the shape of the fiber-receiving grooves of a half-shell.

DETAILED DESCRIPTION OF THE INVENTION

FIG. 1 shows a cross section through a thyristor column. A frame-like clamping device 1 surrounds a stack 5 of thyristors 5a and cooling capsules 5b, as well as end pieces 8 and 9, into which clamping elements 10 and 11 are screwed. Clamping device 1 consists of two straight parts 1a each of which connects two parts 1b taking the form of circular arcs, and each having an arc length of a semi-circle. Thyristors 5a and cooling capsules 5b are arranged in alternation with each thyristor 5a being located between two cooling capsules 5b. Air-cooling elements can also be used instead of the liquid cooling capsules illustrated. Cooling capsules 5b also serve to conduct current in stack 5. End pieces 8 and 9 have the form, in cross-section, of a circular segment and reset with their circular-arc sides fitted in the circular, arc-shaped parts 1b of clamping device 1, in a form-fit manner. End pieces 8 and 9 can be used as connections for current to the stack. End piece 8 is provided with a hole 12 and a cutout 13 in which clamping element 10 is received. End piece 9 is provided with hole 14 and cutout 15 for receiving clamping element 11. The two clamping elements 10 and 11, of which at least one is designed as a resilient (elastic) power accumulator, terminate on, and contact, end faces 6 and 7 of stack 5. A screw serves as clamping element 10. As shown, clamping element 11, screwed into end piece 9, is a resilient compensation element. Clamping element 11 consists of a bumper 28, one or more cup springs 29, and a support part 30. Bumper 28 is pushed by the cup springs 29 against end face 7 of stack 5. Cup springs 29 are located in a concentric space between bumper 28 and support part 30. Support part 30 is screwed into end piece 9. Frame-like clamping device 1, together with end piece 9 and support part 30, constitutes the abutment for cup springs 29. A clamping element of this type has been described in detail in DE-OS No. 19 14 790. In the center of the wall of each of arc-shaped part 1b clamping device 1, there is a cutout 26 for giving access to clamping element 10 and clamping element 11. By turning one or both clamping elements 10 and 11, the required contact pressure is transmitted to the end faces of the stack 5. Clamping elements 10 and 11 contact end faces 6 and 7 by means of point bearings 16 and 17. Because of the point contacts, bearings 16 and 17 can move like joints relative to end faces 6 and 7 of stack 5. During rough adjustment of the contact pressure, end pieces 8 and 9 can align themselves in circular arc parts 1b of clamping device 1 by rotation through small angles. Departures from parallel of the contact surfaces of the thyristors and cooling capsules in stack 5 can thus be accommodated and transmitted via point bearing 17 to clamping element 11 and are compensated by the latter; contraction or expansion arising from thermal stresses which can occur in the stack 5 when the thyristor is used at different temperatures are compensated in the same way.

Clamping device 1 is preferably made of two identical half-shells of plastic which are held together by wound webs of reinforced plastic. The winding of the fiber bundles, their position on clamping device 1, and the method of casting will be described in connection with FIGS. 5 to 9. For the winding, glass fiber bundles or carbon fiber bundles can be used. In the following, glass fiber bundles are described, which are made up of turns around the clamping device. Because parts 1b of the clamping device 1 are curved as circular arcs and end pieces 8 and 9 are fitted therein on their circular-arc sides, the forces occurring when the thyristor column is clamped are transmitted to straight side parts 1a of the clamping device 1. The glass fiber bundles rest tangentially on the clamping device 1 at each point on the outer surface so that no bending moments occur in clamping device 1. In the center of side part 1a, a cutout 27 is arranged which can be used, for instance, for holding connecting leads or for centering parts.

Clamping device 1 consists of two identical half-shells 2 of a plastic material, for instance, polyester resin. In FIGS. 2 and 3, side views of half-shells having different shapes are shown. The half-shell 2 of FIG. 2 consists of a straight side part 3 and two adjoining parts 4, each of which consists of a curved part and a straight end part terminating in an end face 22. The half-shell 2 of FIG. 3 consists of a straight part 3 and two curved parts 4 in the form of circular arcs each having an arc length of a quarter circle and terminating in an end face 22.

Half-shell forms other than those of FIGS. 2 and 3 are possible. For example, the half-shell can also consist of two straight parts and a part curved as a circular arc with the arc length of a semi-circle. When two such half-shells are assembled, a frame-like clamping device of the same form as part 1 in FIG. 1 is obtained. The joints between the two half-shells are then located in the straight parts of the clamping device and not in the curved parts. Also, the curved portions may follow some other form than circular, such as elliptical, etc. In any event, the length of a straight part 3 of half-shell 2 must be matched to the height of stack 5 of thyristors and cooling capsules.

In the following discussion, the form of the half-shell shown of FIG. 3 is used. When two half-shells 2 are assembled with their end faces 22 resting against each other, the frame-like clamping device, shown in FIG. 1, is obtained. The front view onto a half-shell 2 of clamping device 1 is shown in FIG. 4. Two grooves or channels 18 run, parallel to the lateral surfaces 20, around the outer periphery of half-shell 2. Grooves 18 are designed as slots having rectangular cross-sections and are arranged symmetrically on either side of a central part 19, which circles the outer surface of each half-shell 2 in the middle region between the two lateral surfaces 20. Central part 19 has an outside surface 25. By the symmetrical arrangement of the two channels, provision is made for uniform loading of clamping device 1, as will be seen from the discussion of FIG. 5. A guide channel 21 is arranged on the inside surface of half-shell 2, parallel to the lateral surfaces 20 of the half-shell 2. It is an inside slot, extending all around the assembled clamping device. Guide channel 21 is located under center part 19 between the two lateral surfaces of half shell 2 and serves the special purposes of guiding or receiving leads and centering structural elements. The way in which the two end faces 22 terminate each half-shell 2 can be seen in FIG. 4.

Two half-shells 2 are assembled to form the frame-like clamping device described in FIG. 1 so that the end faces 22 of the two half-shells 2 rest against each other. Such an assembly is shown in FIG. 5, where a cross-section through a clamping device 1 having end pieces 8 and 9 is shown, being without clamping elements 10 and 11 and without stack 5 of thyristors and cooling capsules. This view is taken perpendicular to the direction of the section of FIG. 1. In each groove 18 which extends around the entire outside surface of the two assembled half-shells 2, being aligned flush at the joints between end faces 22 of the two half-shells, several turns of glass fiber are wound, forming bundles 23. One turn of glass is a complete loop, closed upon itself, and several turns form a glass fiber bundle 23 around clamping device 1. The turns of glass fiber bundles 23 are cast with a casting compound, preferably a liquid plastic, such as a polyester resin, so that the glass fiber bundles are firmly embedded in a solid body 24 formed in each groove. The glass-fiber-reinforced plastic body, so produced forms, a strong joint between the two half-shells 2 in the region where end faces 22 rest against each other. Hole 12 and cutout 13 for receiving clamping element 10 are arranged in end piece 8 and hole 14 and cutout 15 for receiving the clamping element 11 are arranged in end piece 9. Cutouts 26 in wall 19 of clamping device 1 are located over holes 12 and 14 in end pieces 8 and 9. Clamping elements 10 and 11 are accessible through holes 26. Surface 25, which is located on central part 19 and shows more clearly in FIGS. 4 and 6, can be seen in FIG. 5 as a line terminating at end faces 22. Clearly visible in FIG. 5, in straight side part 1a of clamping device 1, is cutout 27, passing through wall 19. Such cutouts 27 can be made at any point on surface 25 and can be used, for instance, for holding leads or for centering structural parts. For the strength of clamping device 1, particularly in the heavily stressed parts 1b, it would be best to wind the turns forming glass fiber bundles 23 as uniformly as possible over the entire width of the outside surface of clamping device 1. However, this is not possible because the area 25 left free of glass fiber bundles for passage of cutouts 27. If glass fiber bundles were present on the surface 25, they would be interrupted by the holes 27 and therefore make no contribution to the strength of the clamping device. Nevertheless, in order to obtain as uniform as possible a loading of the clamping device 1, particularly in region of parts 1b, the two grooves, and, therewith, the turns of glass fiber bundles 23, are arranged symetrically with respect to central part 19.

FIG. 6 is a cross-section through a side of clamping device 1, and clearly shows the cast fiber glass bundles 23 which are cast with plastic 24 in the channels 18. On the reverse side of the central wall portion 19, there is guide channel 21, provided in the shape of an inside slot. Surface 25 of central wall portion 19 is free of glass fibers and casting compound. This is advantageous because no turns of glass fiber bundles are cut when holes 27 are made. In addition, holes 27 can be made more easily.

In FIGS. 7 to 9, further embodiments of channel 18 are shown. In FIG. 7, channel 18 has a U-shaped cross-section; in FIG. 8, a trapezoidal cross-section. With these shapes, the packing density and, therefore, the filling of space with turns of glass fiber bundles can be varied to provide for easy flow of the casting compound between the turns of glass fiber bundles, and thus a better fill of the spaces; greater strength of the looped webs of fiber-glass reinforced plastic is thereby achieved. In FIG. 9, the serrated groove bottom provides a slip-proof surface for seating the first layer of fiber glass turns in the bundles.

What is claimed is:

1. In a thyristor column having a stack of thyristors and cooling capsules, two end pieces, each end piece having a clamping element, and a frame-like clamping device surrounding the stack the end pieces in an electrically insulating manner, and each clamping element resting on an apposite end of the stack and at least one of the clamping elements being resilient, the improvement comprising:
    the frame-like clamping device having two identical half-shells of insulating material with continuous outer surfaces and end faces which meet each other, providing a smooth transition of outer surfaces;
    each of the two half-shells having at least one straight part and at least one curved part and having two lateral surfaces;
    each of the two end pieces lying in an approximately form-fitting manner in a curved part of the clamping device;
    at least one groove being arranged on at least parts of the outer surface of each half-shell and parallel to the lateral surfaces thereof; and
    a bundle comprising more than one turn of fibers wound in the groove and embedded in a casting compound.

2. A thyristor column in accordance with claim 1 in which the insulating material being a plastic.

3. A thyristor column in accordance with claim 2 in which the fibers being glass fibers.

4. A thyristor column in accordance with claim 2 in which the fibers comprises carbon fibers.

5. A thyristor column in accordance with claim 1, in which each half-shell has two curved parts.

6. A thyristor column in accordance with any one of claims 1 to 5 in which the casting compound comprises a plastic.

7. A thyristor column in accordance with claim 5 in which each half-shell has two curved parts in the shape of circular arcs, each arc length comprising a quarter circle.

8. A thyristor column in accordance with any one of claims 1, 5 or 7 in which each groove is in the curved parts of clamping device.

9. A thyristor column in accordance with any one of claims 1, 5 or 7, in which each of the two half-shells has two parallel grooves.

10. A thyristor column in accordance with any one of claims 1, 5 or 7, and further comprising:
at least one guide channel on the inside surface of the clamping device, the guide channel running parallel to the lateral surfaces of the clamping device.

11. A thyristor column in accordance with claim 10 in which the guide channel is located midway between the two lateral surfaces of the clamping device and comprises a wall portion.

12. A thyristor column in accordance with claim 10 in which the surface area on the outside of the wall portion over the guide channel is free of fibers.

13. A thyristor column in accordance with claim 12 and further comprising a cutout in the wall portion of each clamping device, via which the clamping elements are accessible, each cutout centered in the curved parts and between the two lateral surfaces.

14. A thyristor column in accordance with claim 1 in which each groove has a rectangular cross section.

15. A thyristor column in accordance with claim 1 in which each groove in the clamping device has a U-shaped cross-section.

16. A thyristor column in accordance with claim 1 in which each groove in the clamping device has a trapezoidal cross-section.

17. A thyristor column in accordance with claim 1 in which the bottom of each groove in the clamping device having a serrated cross-section.

18. A thyristor column in accordance with claim 1 in which the clamping device has at least one cutout at a predetermined point in the outside surface over the guide channel.

19. A thyristor column in accordance with claim 1 and further comprising:
a two point bearing on each clamping element, each bearing resting on the associated end face of the stack of thyristors and cooling capsules.

* * * * *